United States Patent [19]
Thomas, Jr.

[11] Patent Number: 5,995,556
[45] Date of Patent: *Nov. 30, 1999

[54] FRONT END FOR GPS RECEIVERS

[75] Inventor: Jess Brooks Thomas, Jr., La Canada, Calif.

[73] Assignee: California Institute of Technology, Pasadena, Calif.

[*] Notice: This patent is subject to a terminal disclaimer.

[21] Appl. No.: 07/533,836

[22] Filed: Jun. 6, 1990

[51] Int. Cl.$^6$ .............................. H03K 9/00; H04L 27/06
[52] U.S. Cl. ............................................ 375/316; 375/367
[58] Field of Search .................................. 375/1, 75, 96, 375/97, 115; 342/352, 357, 358; 364/459, 728; 370/104; 455/12, 13

[56] References Cited

U.S. PATENT DOCUMENTS

| | | | |
|---|---|---|---|
| 4,422,047 | 12/1983 | Wright | 455/73 |
| 4,426,712 | 1/1984 | Gorski-Popiel | 375/115 |
| 4,445,223 | 4/1984 | Jasper et al. | 375/96 |
| 4,457,006 | 6/1984 | Maine | 375/97 |
| 4,485,383 | 11/1984 | Maher | 375/114 |
| 4,669,095 | 5/1987 | Hall | 375/96 |
| 4,704,734 | 11/1987 | Menich et al. | 455/33 |
| 4,785,463 | 11/1988 | Janc et al. | 375/1 |
| 4,821,294 | 4/1989 | Thomas, Jr. | 375/96 |
| 5,220,583 | 6/1993 | Solomon | 375/328 |

OTHER PUBLICATIONS

Bandpass Signal Sampling and Coherent Detection by W.M. Waters and B.R. Jarrett, IEEE Trans. on Aerospace and Electronic Systems, vol. AES–18, No. 4, p. 731, 1982.

Quadrature Sampling with High Dynamic Range by D.W. Rice and K.H. Wu, IEEE Trans. on Aerospace and Electronic Systems, vol. AES–18, No. 4, p. 736, 1982.

On the Performance of Digital Detectors with Dependent Samples by N.C. Beaulieu, IEEE Trans. Commun., vol. COM–36, p. 1248–1254, Nov. 1988.

On Quadrature Sampling of Bandpass Signals by J.L. Brown, Jr., IEEE Tran. Aero, & Electr. Systems, vol. AES–15, No. 3, p. 366, 1979.

Ultrasound Phased Delay Lines Based on Quadrature Sampling Techniques by J.E. Powers, D.J. Phillips, M.A. Brandestini, R.A. Sigelmann, IEEE Trans. Sonics & Ultrasonics, vol. SU–27, No. 6, p. 287, 1980.

Quadrature Sampling of High Frequency Waveforms by O.D. Grace and S.P. Pitt, J. Acoust. Soc. Amer., vol. 44, p. 1453, 1968.

Recovering the Spectrum of a Narow–Band Process from Syncopated Samples by P.H. Milenkovic, DSN Progress Report 42–51, p. 47, Mar. 1979.

Digital Processing of Bandpass Signals by M.C. Jackson and P. Matthewson, GEC Journal of Research, vol. 4, No. 1, p. 32, 1986.

*Primary Examiner*—Stephen Chin
*Attorney, Agent, or Firm*—Darby & Darby P.C.

[57] ABSTRACT

The front end in GPS receivers has the functions of amplifying, down-converting, filtering and sampling the received signals. In the preferred embodiment, only two operations, A/D conversion and a sum, bring the signal from RF to filtered quadrature baseband samples. After amplification and filtering at RF, the L1 and L2 signals are each sampled at RF at a high selected subharmonic rate. The subharmonic sample rates are approximately 900 MHz for L1 and 982 MHz for L2. With the selected subharmonic sampling, the A/D conversion effectively down-converts the signal from RF to quadrature components at baseband. The resulting sample streams for L1 and L2 are each reduced to a lower rate with a digital filter, which becomes a straight sum in the simplest embodiment. The frequency subsystem can be very simple, only requiring the generation of a single reference frequency (e.g. 20.46 MHz minus a small offset) and the simple multiplication of this reference up to the subharmonic sample rates for L1 and L2. The small offset in the reference frequency serves the dual purpose of providing an advantageous offset in the down-converted carrier frequency and in the final baseband sample rate.

11 Claims, 4 Drawing Sheets

FRONT END FOR GPS RECEIVERS

ORIGIN OF INVENTION

The invention described herein was made in the performance of work under a NASA contract, and is subject to the provisions of Public Law 96-517 (35 USC 202) in which the Contractor has elected to retain title.

TECHNICAL FIELD

The present invention relates generally to digital receivers and more specifically to a highly digital front end for receivers employed in the Global Positioning System (GPS).

BACKGROUND ART

PRIOR ART

The NAVSTAR/GLOBAL POSITIONING SYSTEM (GPS) will, when fully operational, allow users anywhere in the world to determine three-dimensional position and velocity, accurately synchronize clocks, measure ionosphere electron content and perform geodetic measurements. Such determinations are based on the measurement of the transit time and carrier phase of RF signals from a number of GPS satellites selected from a total constellation of 24. Observation of at least four satellites are typically obtained for accurate navigation purposes. The-visible satellites offering the best geometry can be selected either manually or automatically by receivers using ephemeris information transmitted by the satellites. The GPS signal transmitted from the space vehicles consists of two RF frequencies, L1 at 1575.42 MHz and L2 at 1227.6 MHz. The L1 signal is modulated with both P and the C/A pseudo-random noise codes in phase quadrature. The L2 signal is modulated with the P code. Both the L1 and L2 signals are also continuously modulated with the navigation data-bit stream at 50 bps. The functions of the codes are twofold: (a) identification of space vehicles, as the code patterns are unique to each space vehicle and are matched with like codes generated in the user receiver; and (2) the measurement of the GPS signal transit time from satellite to user, obtained by measuring the phase shift required to match the codes. The P code is a long (7 days) 10.23 MHz code that provides precise measurement of transit time but is difficult to acquire. The C/A (clear access) code is a short (one millisecond) code, readily acquired, but operating at 1.023 Mbps, which provides a more coarse measurement of delay. The C/A code is normally acquired first and a transfer is made to the P code.

The navigation data-bits contain the information that the user's receiver requires to perform the operations and computations for successful navigation with the GPS. The data include information on the status of the space vehicle; the time synchronization information for the transfer from the C/A to the P code; and the parameters for computing the clock correction, the ephemeris (position) of the space vehicle and the corrections for delays in the propagation of the signal through the atmosphere. In addition, it contains almanac information that defines the approximate ephemerides and status of all the other space vehicles, which is required for use in signal acquisitions. The data format also includes provisions for special messages.

The GPS user measures the apparent transit time by measuring the delay or time shift between the pseudo-random noise (PRN) code generated in the space vehicle and the identical code sequence generated by the user receiver, with each synchronized with its own clock. The receiver code is shifted until maximum correlation is achieved between the two codes; the time magnitude of the shift is the receiver's measure of transit time or delay. Ranges to the observed satellites are determined by scaling the measured signal transit time by the speed of light. When measurement of range to the satellites is made by a user with an imprecise clock, as is usually the case, the measured ranges are called "pseudo-ranges" because they contain a bias of fixed magnitude due to the clock error. GPS receivers also extract carrier phase (L1 or both L1 and L2) from the received signals in order to obtain an extremely precise measure of time variation of the ranges to the GPS satellites. The L1 and L2 range (and phase) can be combined in a manner that estimates and eliminates the corrupting charged-particle shifts caused by the ionosphere. As mentioned above, the range and carrier phase measurements can serve a variety of important applications.

The GPS signals collected by a GPS receiver are first processed by "front end" instrumentation that converts the RF signal to a filtered and sampled form at baseband. As used herein, the term "baseband", is defined as any frequency range which either includes zero frequency or is not significantly greater than zero frequency. In prior implementations, the front end amplifies and filters the RF signal and then down-converts it to baseband, using some combination of analog components including amplifiers, filters and mixers. The signal is then digitized for subsequent processing. The required analog components in such front ends are relatively bulky and introduce relatively large and unstable delays and phase shifts. There is, therefore, a need for a digital front end for GPS receivers, which obviates such analog components.

Disclosures of relevance to the present invention include the following:

(1) J. L. Brown, Jr., "On Quadrature Sampling of Bandpass Signals," IEEE Tran. Aero, & Electr. Systems, vol. AES-15, No. 3, p. 366, 1979.

(2) Powers et al., "Ultrasound Phased Delay L1nes Based on Quadrature Sampling Techniques," IEEE Trans. Sonics & Ultrasonics, vol. SU-27, No. 6, p. 287, 1980.

(3) O. D. Grace and S. P. Pitt, "Quadrature Sampling of High-Frequency Waveforms," J. Acoust. Soc. Amer., vol. 44, p. 1453, 1968.

(4) P. H. Milenkovic, "Recovering the Spectrum of a Narrow-band Process from Syncopated Samples", DSN Progress Report 42-51, p. 47, March 1979.

(5) M. C. Jackson and P. Matthewson, "Digital Processing of Bandpass Signals," GEC Journal of Research, vol. 4, no. 1, p. 32, 1986.

(6) W. M. Waters and B. R. Jarrett, "Bandpass Signal Sampling and Coherent Detection," IEEE Trans. on Aerospace and Electronic Systems, vol. AES-18, no. 4, p. 731, 1982.

(7) D. W. Rice and K. H. Wu, "Quadrature Sampling with High Dynamic Range," IEEE Trans. on Aerospace and Electronic Systems, vol. AES-18, no. 4, p. 736, 1982.

(8) N. C. Beaulieu, "On The Performance Of Digital Detectors With Dependent Samples", IEEE Trans. Commun., Vol. COM-36, p. 1248–1254, November, 1988.

SUMMARY OF THE INVENTION

A digital front end in GPS receivers offers a number of advantages relative to analog implementations, including more compactness, better reliability, and greater accuracy. Absolute delay errors due to instrumentation can be reduced to a fraction of a nanosecond with a digital front end, without continuous calibration. Comparable performance is very difficult to achieve with analog designs.

In the preferred embodiment, the digital front end presented herein performs only two steps to bring the signal (L1 or L2) from RF to a filtered and sampled form at baseband: commensurate (subharmonic) sampling and a sum. In subharmonic sampling, the sample rate is synchronous with a subharmonic of a given frequency in the RF spectrum, which causes that particular frequency to be aliased to zero frequency. The spectrum surrounding the given frequency is aliased to baseband as though it had been down-converted with a mixing signal equal to the given frequency. Thus, sampling and down-conversion can be carried out simultaneously. In contrast, an analog implementation would mix the signal with an LO signal, filter to remove the sum note, and then sample.

In the preferred embodiment, the subharmonic sample rates for L1 and L2 are selected to satisfy several criteria; namely, that they: a) are each simple multiples of a final baseband sample rate equal to 20.46 MHz minus a small offset; b) satisfy the "half-subharmonic" sampling rules; and c) are approximately equal to one another with values of a few hundred MHz. When criterion a) is satisfied, the frequency subsystem is very simple, requiring only the generation of a single reference frequency (20.46 MHz minus a small offset) and the multiplication of this reference up to the subharmonic sample rates for L1 and L2. Furthermore, reduction of the initial high sample rate to about 20.46 MHz is a simple process because sample combining can be based on integer numbers of samples. The small offset in the reference serves the dual purpose of providing an advantageous offset in the down-converted carrier frequency and in the final baseband sample rate. Half-subharmonic sampling, criterion b), provides two advantages: simple sampling logic to accurately provide quadrature (I and Q) samples and sign-flip corrections that remove any bias in the sampled signal. With regard to criterion c), the L1 and L2 sample rates are assigned approximately equal values in order to obtain approximate symmetry between channels. In addition, the rates are assigned large values so that preceding analog filters can have large bandwidths and small delay errors if required and so that the time separation between associated I and Q samples will be small. An analysis and correction procedure are presented to account for the small time separation that remains.

OBJECTS OF THE INVENTION

It is therefore a principal object of the present invention to provide a digital front end for GPS receivers wherein commensurate sampling is performed at RF in order to translate the RF signal to baseband, thereby eliminating the need for analog down-conversion to lower frequency.

It is an additional object of the present invention to provide a digital front end for GPS receivers wherein RF sampling is performed at a high rate thereby allowing use of wide analog filters with small delays, if required, also making the time separation of associated quadrature component samples very small and allowing the use of oversampling to reduce SNR loss due to quantization.

It is an additional object of the present invention to provide a digital front end for GPS receivers wherein only commensurate sampling and a simple sum are all that are required to bring an RF signal to a filtered and sampled form at baseband.

It is still an additional object of the present invention to provide a digital front end for GPS receivers wherein RF sampling rates for the L1 and L2 signals are each simple multiples of the baseband sample rate and can therefore be generated as simple multiples of a single reference frequency.

It is still an additional object of the present invention to provide a digital front end for GPS receivers wherein the RF sample rate for L1 and L2 are each offset from exact commensurability with their respective L-band carrier so that an advantageous offset will be present in both down-converted carrier frequency and in final baseband sample rate.

It is still an additional object of the present invention to provide a digital front end for GPS receivers wherein the RF sample rates are half-subharmonic rates thereby making the sampling logic to obtain quadrature samples simpler and more accurate.

BRIEF DESCRIPTION OF THE DRAWINGS

The aforementioned objects and advantages of the present invention, as well as additional objects and advantages thereof, will be more fully understood hereinafter as a result of a detailed description of a preferred embodiment of the invention when taken in conjunction with the following drawings in which.

DETAILED DESCRIPTION OF A PREFERRED EMBODIMENT

High Level Functional Description

Figure 1:
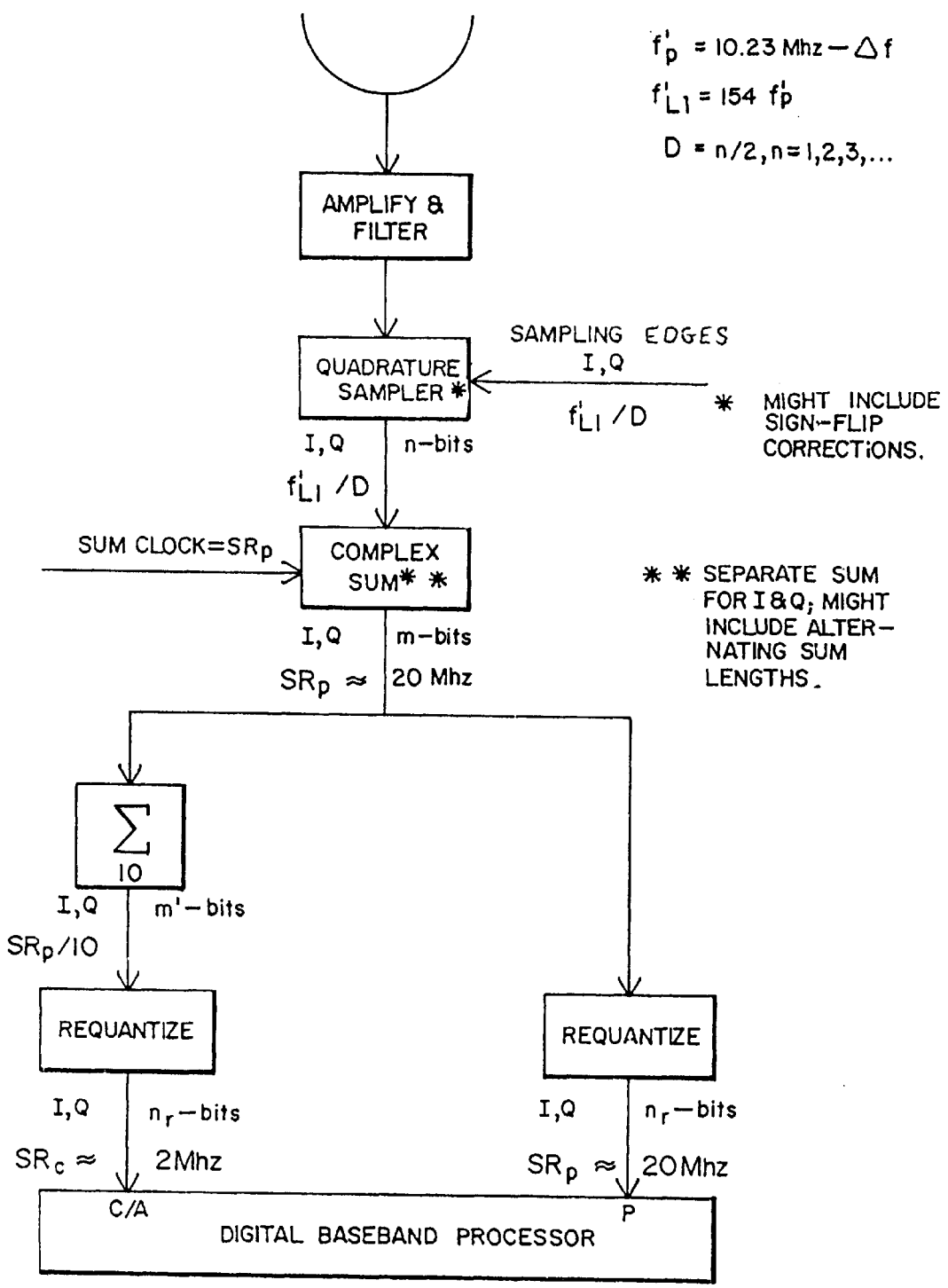
FIG. 1 is a top level functional block diagram of an L1 channel GPS digital front end in accordance with the present invention.

A top level functional block diagram is shown in FIG. 1 for the L1 channel. The signal collected by the antenna is amplified and filtered at RF. It is then quadrature sampled at a high rate commensurate with the L1 carrier. (In this application, "sampler" and "A/D conversion" will be used interchangeably as shorthand for a process that actually consists of two steps: sampling and analog-to-digital conversion). The spectrum surrounding the carrier is aliased to baseband by the sampling process.

After sampling, the signal is filtered and the data rate reduced to about 20 MHz. The simplest rate-reducing and filtering method is to "sum and dump" the data stream with a sum length equal, on average, to the number of sample points that reduces the sample rate to about 20 MHz. This sum is equivalent to a sinx/x filter in the frequency domain centered at zero baseband frequency with a first null at 20 MHz. Even though the filter shape is not optimal, its simplicity in implementation might justify the small losses in SNR (about 0.2 dB) and in delay precision (about 20%) relative to a rectangular filter with 10 MHz bandwidth. In many applications, the loss in SNR will be negligible while the loss in delay precision will not be significant compared to other errors remaining after averaging and/or "carrier-aiding" techniques have been applied. However, if greater delay precision is needed, the sum in FIG. 1 could be replaced by a digital filter with a rectangular bandpass and a single-sided noise bandwidth of 10 MHz.

For the second, rectangular filter option, one pays a stiff price in greater hardware complexity to gain a small, but non-negligible improvement in delay precision. The improvement in delay precision is due to the fact that more signal power is located at higher frequencies in the rectangular-digital-filter option. Delay precision tends to improve as the effective width of the signal spectrum increases.

Either of the above filtering options will increase the number of levels needed to represent the signal, relative to the original sampled form. In most cases, an additional step will be required to requantize the signal and reduce the number of levels to a number compatible with the baseband digital processor.

For several reasons, the RF sample rate is not made exactly commensurate with the nominal carrier frequency, as implied above, but with a frequency slightly offset from the carrier frequency. That offset is made large enough to place the aliased carrier frequency at a positive value at baseband for all expected doppler shifts. An offset is also needed to shift the baseband sample rate away from 20.46 MHz, which insures its effective incommensurability with the P chip rate of 10.23 MHz. Avoidance of zero baseband carrier frequencies is necessary if the carrier counter-rotation sinusoid in the baseband processor is quantized to only a few levels (e.g., three levels) or if the option of nonquadrature baseband operation is a design goal. A minimum baseband carrier frequency of 10 KHz, including doppler, satisfies both of these goals. Incommensurability with the P chip rate is required in high-accuracy-delay measurements whenever the doppler rate is zero.

a) Commensurate Sampling

Figure 2:
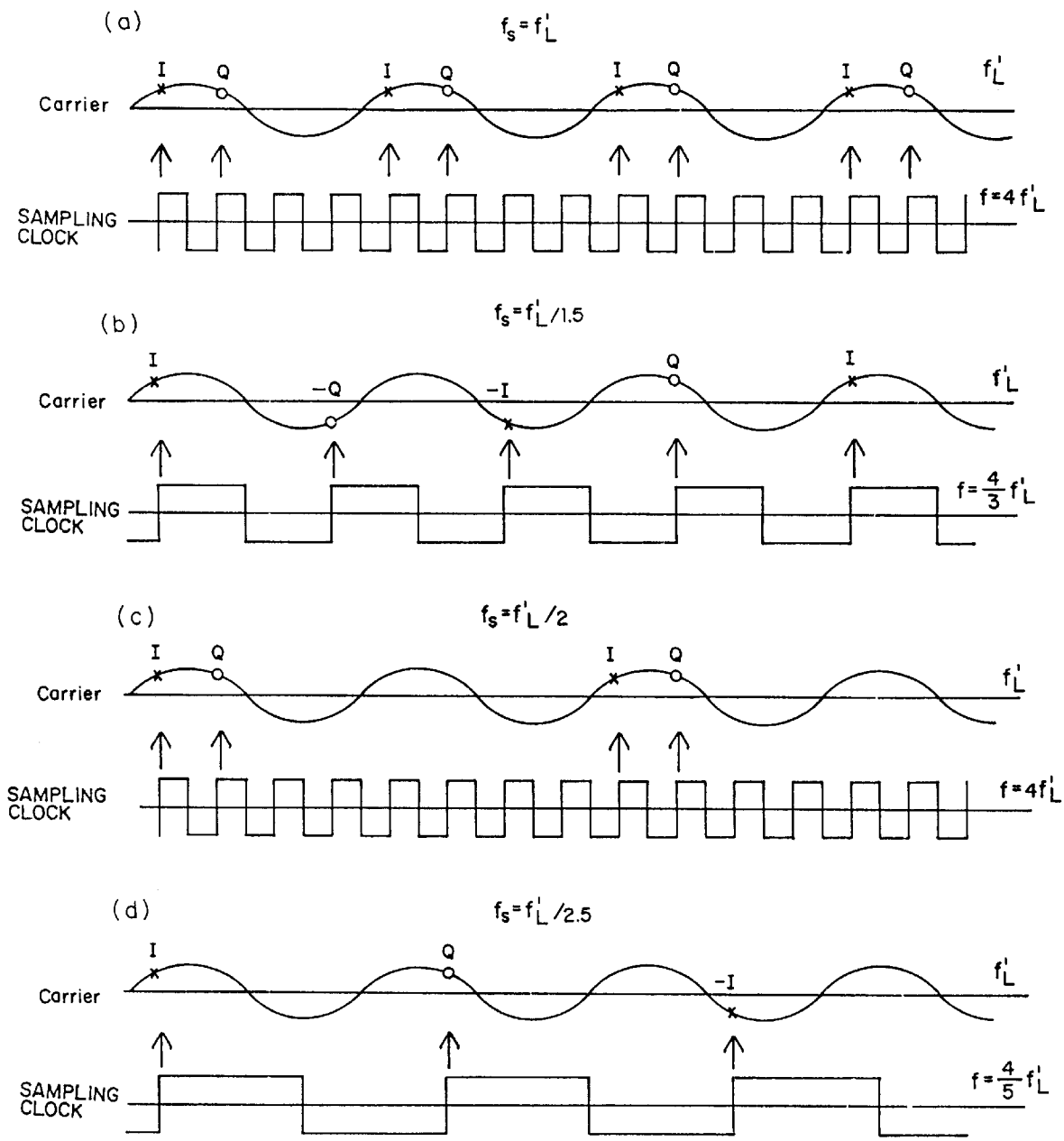
FIG. 2, comprising waveforms a–d, is a series of graphical examples of quadrature commensurate sampling.

If quadrature sampling is desired, two interleaved sequences of sample points, often referred to as the "in-phase" (I) and "quadrature" (Q) sequences, are generated. These two associated sampling sequences can each be viewed as samples triggered by equally spaced rising edges. The Q sequence is offset from the I sequence by a time shift equivalent to an odd integer multiple of 90 degrees relative to the offset carrier frequency. To have commensurate (subharmonic) sampling, the sample rate for I (or Q) is set equal to $f_L/D$ where $f_L$ is the offset carrier frequency at L band and D is a commensurability divisor equal to an integer divided by 2. FIG. 2 schematically demonstrates how samples at four of the highest sampling frequencies might be generated in quadrature. (Other means can be devised for generating the desired I and Q samples, particularly for the $f_L$/integer cases.) The exemplary sampling frequencies are $f_L$, $f_L/1.5$, $f_L/2$, and $f'/2.5$. To first approximation, the sampling clock signal is assumed to be a square wave.

In FIG. 2, arrows at particular rising edges of each of the four exemplary sampling signals indicate the points that trigger the I and Q samples. The corresponding sample locations of these trigger points are marked on the carrier sinusoid along with an I or Q to denote the character of each sampled point. Note that there is a sign flip on every other I (or Q) point in the "half-subharmonic" cases of $f_L/1.5$, $f_L/2.5$, $f_L/3.5$, etc. These sign flips must be removed in subsequent processing logic. The "half subharmonic" cases are relatively easy to implement since one sampling clock accurately generates interleaved I and Q samples, requiring only a simple flip-flop to separate the I and Q samples. Another advantage of half-subharmonic sampling is the fact that the sign-flip correction nullifies any bias in the sampled signal.

When commensurate quadrature sampling is used, the associated I and Q samples are separated in time and are not coincident as one would ideally require. For sample rates considered in this application, this separation introduces negligible error in phase, but shifts the measured-delay by a constant error (½ the I and Q time separation) that can be accurately corrected, as discussed in the appendix herein.

The prime on the carrier frequency $f'_L$ indicates a small offset from the nominal carrier frequency, an offset introduced by the frequency/timing subsystem in order to place the baseband carrier frequency at positive values for all expected doppler frequencies. The forms of the offset carrier frequencies are given by:

$$f'_{L1} = 154(10.23 \text{ MHz} - \Delta f)$$

$$f'_{L2} = 120(10.23 \text{ MHz} - \Delta f)$$

where $\Delta f$ is the offset relative to the P code chip rate. For ground-based receivers, $\Delta f = 110$ Hz would be adequate, as discussed below.

When driven by a sampling frequency of the form specified above, the sampler will produce sample points that are commensurate with the offset carrier frequency. This commensurability will, in effect, down-convert the signal to baseband with a mixing frequency equal to the offset carrier frequency. A brief explanation of such down conversion sampling is given in the appendix. In order to restrict amplitude loss to about 1% or less, the effective integration time of the sampler should be less than about 8% of an RF period, which translates to a specification of 50 psec or less for L1. Time jitter of the sampler should be restricted to less than 2.2% (1σ) of an RF cycle (14 psec for L1) if amplitude loss due to sampler instability is to be restricted to less than 1%.

Because the sample rate is $f'_L/D$, the Nyquist sampling rule indicates that the double sided noise bandwidth at RF before "down-conversion" cannot be greater than $f'_L/D$. If the noise spectrum is not centered on $f'_L$, but is no wider than $f'_L/D$ in total, sampling will still be adequate. In this case, one can picture the noise spectrum that extends outside the sampling passband of $f'_L \pm f'_L/(2D)$ as aliasing into the sampling passband to fill the "empty part".

In FIG. 1, is assumed the sampler quantizes the signal to $2^n$ levels (n bits). The SNR loss incurred by this digitizing process is presented in TABLE I for 1 to 5 bit sampling, under the assumption that the signal power is very small compared to the noise power across the sampling bandwidth. To restrict voltage SNR loss to less than 1%, one would require at least 4-bit samples (16 levels). The number of bits of quantization is not critical to the basic description and will not be specified.

TABLE I

SNR Loss Due To Sampling Quantization

| # bits | SNR Loss (dB) | SNR Loss (%, voltage) |
|---|---|---|
| 1 | 1.96 | 20.2 |
| 2 | 0.55 | 6.1 |
| 3 | 0.17 | 1.9 |
| 4 | 0.05 | 0.58 |
| 5 | 0.015 | 0.17 | b) Data Rate Reduction and Filtering

After high-rate sampling, the data stream must be filtered and the rate reduced to about 20 MHz. The simplest approach is to sum and dump with a sum length equal, on average, to the number of points required to reduce the RF sample rate to the desired rate. In choosing a baseband sample rate, two approaches are possible: a) basing the offset in the baseband rate on the offset $\Delta f$ in the RF rate; or b) making the two rates independent. Option a) is preferable because it simplifies the hardware and will therefore be used in the preferred embodiment. With this option, the baseband sample rate becomes $2f_P = 20.46$ Mhz $- 2\Delta f$ so that incommensurability of the sample rate and chip rate depends on the proper choice of $\Delta f$. The advantage of option b) is the greater flexibility it allows in selecting the baseband rate, but it can require the generation of a sum clock.

In order to obtain a given baseband sample rate by sum-and-dump operation, alternating sum lengths sometimes must be employed to reduce the RF rate to the desired baseband rate. The errors introduced by this approximation are expected on average to be negligible due to the fact that the sum length varies by only one point out of many and that the baseband sample rate is still so high that subsequent processing will average over many points (e.g., 20,000 to 400,000) before extracting information. TABLE II presents for option a) the sum sequences required to produce the baseband rate of $2f_p$ for a number of RF sample rates.

TABLE II

Examples* Of Sum-Length Sequences For Several Sample Rates

| Carrier Frequency Divisor D | L1 SUM-LENGTH SEQUENCE | L2 SUM-LENGTH SEQUENCE |
|---|---|---|
| 1 | 77 | 60 |
| 1.5 | 51, 51, 52 | 40 |
| 2 | 38, 39 | 30 |
| 2.5 | 30, 31, 31, 31, 31 | 24 |
| 3 | 25, 26, 26 | 20 |
| 3.5 | 22 | 17, 17, 17, 17, 17, 17, 18 |
| 4 | 19, 19, 19, 20 | 15 |
| 4.5 | 17, 17, 17, 17, 17, 17, 17, 17, 18 | 13, 13, 14 |
| 5 | 15, 15, 16, 16, 16 | 12 |

*Option a) RF sample rate = $f_L/D$ for I or Q, baseband rate = $2f_p$

As indicated above, the processing logic must include a sign-flip correction for some sampling schemes. This sign-flip correction could be a separate operation or could be included as part of the A/D conversion or as part of the sum (or digital filter). Also shown in FIG. 1 is an additional average over 10 P sample points, which leads to the C/A baseband signal. (Some receivers accept the 20-MHz P samples as input to the C/A channel).

After summing, the number of bits representing the result will exceed the number of levels allowed by most baseband processors. As indicated in FIG. 1, logic may be required to be requantize the sample points to a smaller number of levels, for both the C/A and P signals.

c) The offsets in Sample Rates

Due to the inclusion of the $\Delta f$ offset term in the "RF" sample rate, the zero-doppler baseband carrier frequency will be offset by $\Delta f$ times 154 and 120 for L1 and L2, respectively. For ground based receivers, the maximum doppler shift is less than 5 KHz, which means that the minimum baseband carrier frequency is of the order of 10 KHz for $\Delta f$=110 Hz, as discussed in the appendix. A minimum baseband carrier frequency of 10 KHz is more than adequate for operating in the nonquadrature mode and for counter-rotating the carrier in subsequent digital processing with a 3-level model sinusoid.

The baseband sample rate should be highly incommensurate with the P chip rate. For the option a) example given above, an offset frequency of $\Delta f$=110 Hz produces a baseband sample rate of 20.45978 MHz. This particular sample rate reduces the commensurability error in delay to less than 10 microchips after 4.5 msec of integration, for the worst case of zero doppler. In contrast, when the sample rate is exactly 20.46 MHz, the worst-case commensurability error is ½ P-chip if the doppler rate is zero. Other choices for the offset frequency will be more appropriate than this particular value in some applications. That issue is not critical for this front end design since changing to another offset frequency would simply require a change in the reference frequency but not in the digital front end. The option of using $\Delta f$=0.0, a value assigned in some designs, is not ruled out by this front end design. Another useful restriction on the frequency offset $\Delta f$ is that it should be an integer multiple of 10 Hz so that the C/A sample rate entering the baseband processor is an integer number of hertz. This constraint makes synchronization simpler because it prevents a 1-PPS timing signal from corresponding to a fractional C/A sample point.

d) Design Tradeoffs For Filters

In selecting the RF filters, one finds that there is a tradeoff between RFI rejection and accuracy of phase and delay. In some GPS applications, minimizing the effects of RF interference (RFI) is an important consideration. If L1 and L2 are each separately filtered with a narrow bandpass (e.g., 20 MHz) about their carriers, then only RFI within those narrow bandpasses will cause problems. Such narrow filters would also allow "RF" record rates at much more manageable levels. Accuracy, on the other hand, would suffer. Analog filters introduce errors and instabilities in phase and delay that become larger as the bandwidth decreases. Such errors can be reduced by stable designs and calibration, but the problem can be greatly diminished if the bandwidths are made very large. Very large bandwidths make much more likely a very desirable design goal: avoidance of continuous on-site phase and delay calibration. Thus we see that, as bandwidths increase, phase and delay errors become smaller while problems with RFI and higher record rates become worse.

Current uses of GPS data in high accuracy, geodetic and earth orbiter applications often use double differencing techniques, at least implicitly, that remove phase and delay shifts introduced by the GPS receivers. Thus, narrow filters in these applications would not be as much of a problem. High-accuracy clock synchronization measurements and high-accuracy ionospheric measurements, on the other hand, would require absolute calibration of receiver delays and would be compromised by the delays of the narrow filters. For these applications, wide filters would be more appropriate. With some care in implementing a 100 MHz filter, for example, calibration and instability errors due to the filter can be reduced to the order of a few hundred psec in delay and several degrees in phase. These numbers indicate that filters that are several hundred MHz wide may be adequate for high-accuracy applications with absolute-delay accuracies approaching 0.1 nsec, without continuous calibration. This discussion indicates that selection of the RF filter width and shape depends very strongly on the goals of the application.

Preferred Embodiment

Figure 3:
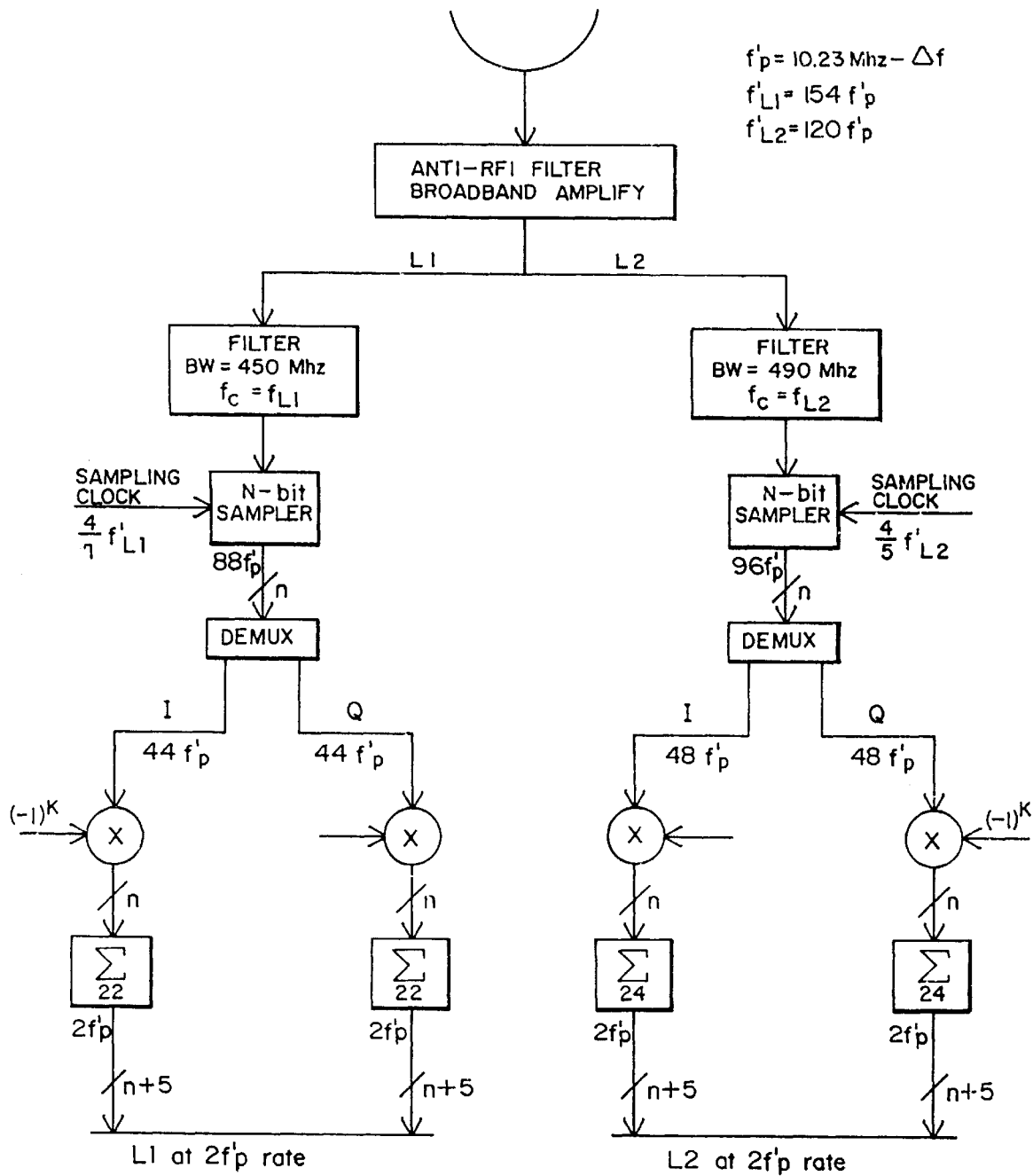
FIG. 3 is a block diagram of a preferred embodiment of the invention.

FIG. 3 presents a functional block diagram of the preferred embodiment. The output of the antenna is passed through an anti-RFI filter and broad-band amplified. The signal is then power divided into L1 and L2 branches and each branch is separately filtered. The filters are centered on the carrier frequencies, with bandwidths of about 450 MHz and 490 MHz, respectively. Each branch is then sampled in half-subharmonic fashion with rates of $4/7\ f_{L1}$ and $4/5\ f_{L2}$, respectively. The output of each sampler is demultiplexed into I and Q samples and each of these outputs is subjected to an alternating sign-flip correction. (The sign-flip correction is shown as a separate operation here for clarity. In practice, this correction could be part of the A/D conversion or part of the accumulation performed by the indicated sum or by a digital filter.) The data rates at this stage are $44f_p$ for L1 I (or Q), and 48$f_P$ for L2 I (or Q). To reach a data rate of 2$f_P$, a sum-and-dump operation is applied to each stream, with a 22-point sum for L1 and a 24-point sum for L2. (Note that this design avoids the cumbersome prospect of alternating sum lengths.) In some applications, each data stream will be requantized to fewer levels to make the data more manageable. At this point, the data streams are passed to a digital processor for phase and delay tracking and extraction of measured delays and phases.

The "RF" sample rates were selected on the basis of integers occurring in the L1 and L2 multipliers (77 and 60 with respect to 20.46 MHz, respectively). The commensurability divisor D is set equal to 3.5 for L1 and to 2.5 for L2, which leads to "RF" sample rates that are integer multiples of $f'_P$, namely, 44$f'_P$ (450.11516 MHz) and 48$f'_P$ (491.034720 MHz), assuming $\Delta f$=110 Hz. Note that the RF sample rates for L1 and L2 satisfy the three criteria specified above. In Table II these are the only values for half-subharmonic sample rates that are nearly balanced for L1 and L2 in the 400–500 Mhz range, with a sum-and-dump operation of fixed length. Half-subharmonic sampling is preferred because it involves a sign-flip correction that removes unwanted signal biases and because it is relatively easy to implement.

Figure 4:
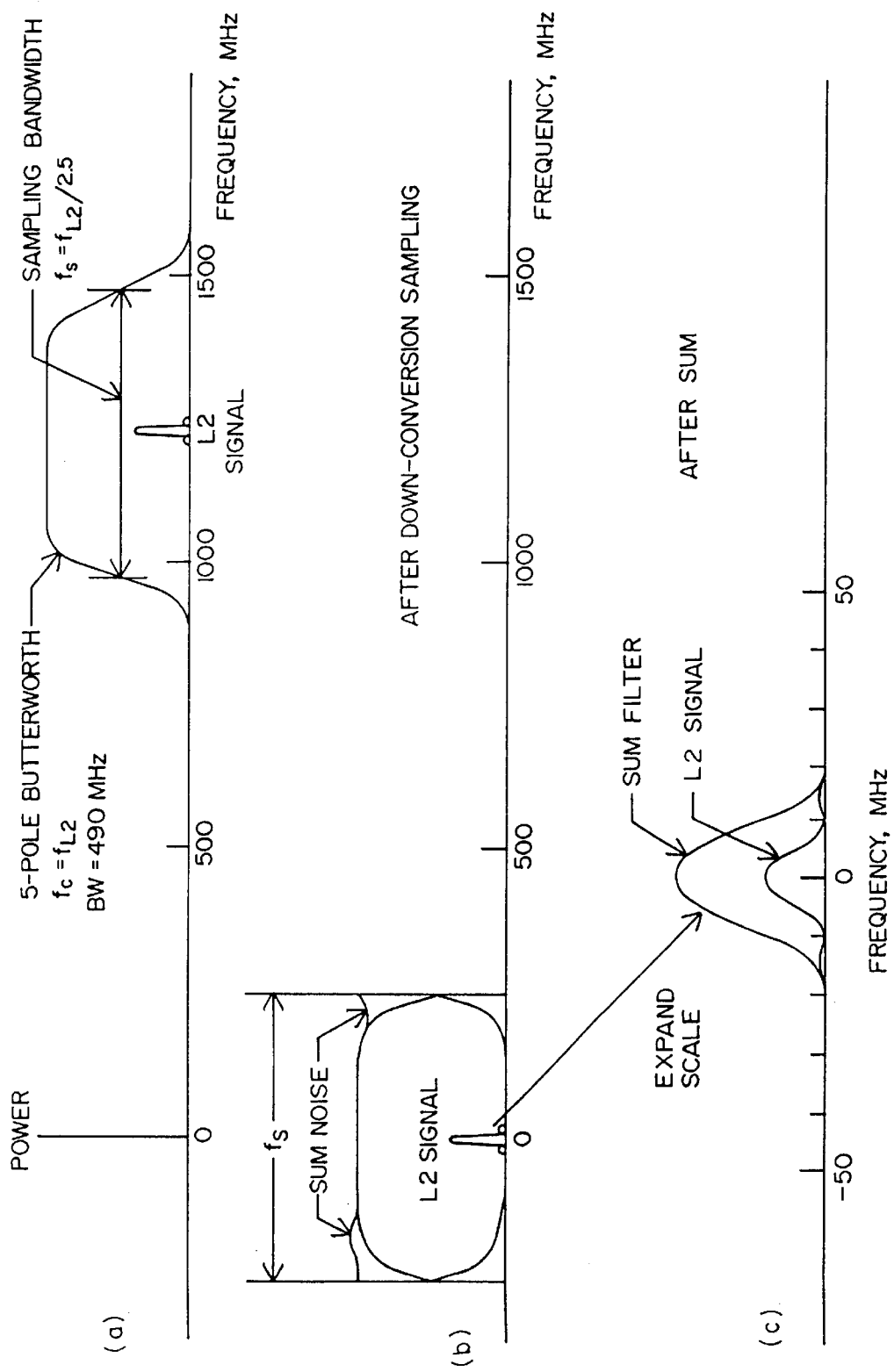
FIG. 4, comprising waveforms a–c is a frequency-domain illustration of the commensurate sampling and filtering of the L2 signal in the preferred embodiment.

FIG. 4 illustrates the L2 signal processing steps in the frequency domain, with the first step showing the signal spectrum and filter shape at RF, the second step showing the spectrum after down-conversion with commensurate sampling, and the third step showing the filter introduced by the sum. (A similar figure could be drawn for the L1 channel). At RF, a 5-pole Butterworth filter is selected because it cuts off fairly rapidly with frequency, but is relatively uncomplicated. For each branch, filter width was set equal to its maximum Nyquist value relative to the sample rate in order to minimize filter delay. An important consideration is the attenuation at the locations of the closest aliased passbands found in subsequent digital filtering, which are separated by 48 $f_P$ (about 490 MHz) from the passband center in FIG. 4. At these points, the filter attenuation is about 30 dB, which should be adequate for most applications.

The delay error introduced by this Butterworth filter can be crudely estimated as follows. A 5-pole Butterworth filter with a 3-dB double-sided bandwidth of 490 MHz would introduce a delay of about 2 nsec in the center region of the passband. Thus, with calibration and stability at the 5% level, the error in this delay would be of the order of 0.1 nsec. This crude calculation suggests that this design should meet a 0.1 nsec goal for absolute error in delay, at least with regard to filter errors.

Variations

Different commensurate sample rates could be used. For example, as indicated in Table II, other carrier-commensurate sample rates can be used in conjunction with other selected sum lengths (sometimes sequenced) to generate the baseband rate of 2$f_P$. Other variations for RF amplification and filtering are possible. For example, instead of separate filters for L1 and L2, the same filter could be applied to both bands before sampling. Alternatively, the analog branch filters in FIG. 3 could be given smaller bandwidths (e.g. 100 Mhz rather than 450–490 Mhz).

The resultant "oversampling" for that embodiment would "recover" much of the SNR loss incurred as a result of n-bit sampling, particularly 1-bit sampling.

In designs that require a sign-flip correction, instead of a separate operation the correction could be made a part of the A/D conversion or part of the combining of sample points that reduces the data rate. The sample rates produced by the initial sampling could be reduced by combining points in several ways. For example, instead of the straight sum presented in the preferred embodiment, an alternate filtering approach would be use of a digital filter. As mentioned above, a rectangular digital filter would improve delay precision.

A further variation that greatly simplifies the digital front end is to give the analog branch filters bandwidths of about 20.46 Mhz (rather than 450–490 Mhz as shown in FIG. 3) and to sample the L1 and L2 branches at the same rate of 20.46 Mhz–2$\Delta f$. No sign-flip correction would be required. Since the initial sample rate is the desired rate, this design eliminates the need for rate-reducing operations. Further, the frequency subsystem would have to generate only one reference frequency—the sample clock at 20.46 Mhz–2$\Delta f$. An additional advantage of this design is the improved RFI rejection provided by the 20.46 Mhz filter relative to the 450–490 Mhz filters of the preferred embodiment. If quadrature samples are required, the hardware could generate another set of sample points, offset from the original set by a time interval equivalent to a quarter of an L-band cycle (L1 or L2) times an odd integer. On the negative side, the design has relatively large analog delays due to the narrow filter at L-band and does not provide the opportunity to reduce SNR loss (caused by quantization) by oversampling.

In the preferred embodiment presented above, both the RF sample rate and reduced baseband sample rate were based on the frequency offset $\Delta f$. Greater flexibility can be obtained by relaxing this constraint and allowing independent selection of these two rates. The price paid for this flexibility is greater complexity in hardware and alternating sum lengths in the sum filter. For an arbitrary baseband sample rate, sum logic could be implemented that started and dumped the sum according to a "sum clock" signal with rate $SR_P$.

The hardware would include logic for handling the sample points at the sum edges when those points were coincident with the start/stop signal.

Summary and Conclusions

It will now be understood that what has been disclosed herein comprises a highly digital front end for GPS receivers that greatly reduces size and complexity relative to prior designs while improving reliability, stability and accuracy (e.g. to 0.1 nsec in delay). In the preferred embodiment, only two steps bring a signal from RF to filtered "20-MHz" samples at baseband: sample and sum. Commensurate (subharmonic) sampling allows the sampling operation itself to down-convert the RF signal to baseband. The selected RF sample rates are 88 (10.23 MHz–$\Delta f$) for L1 and 96 (10.23 MHz–$\Delta f$) for L2. Numerous advantages are provided by the preferred embodiment:

a) The sample rates for L1 and L2 are approximately equal;

b) The sample rates are "half-subharmonic" so that quadrature samples are simply and accurately generated and so that sign-flip connections eliminate possible signal biases;

c) After demultiplexing into the two quadrature-component streams, the rates are still an integer multiple of the desired final rate of 20.46 MHz–2$\Delta f$. This integer relationship simplifies rate reduction through sample combining;

d) The initial sample rates for both L1 and L2 are very high (~900 Mhz for L1 and ~982 MHz for L2). As a result, the time separation of associated quadrature-component samples is very small (~1 nsec). Further, these large rates allow the use of wide analog filters preceeding sampling so that delay errors and instabilities due to said filters can be reduced to very small values (~0.1 nsec). Alternatively, narrower analog filters (e.g., ~100 MHz) can precede the high rate sampling so that the filtered signal is greatly oversampled. Such oversampling allows "recovery" of some of the SNR loss incurred when the A/D conversion involves a small number of levels. For example, for sign (1-bit) sampling, as much as 1.5 dB of the maximum SNR loss of 2 dB can be recovered;

e) The sample combining operation is very simple, comprising a sum-and-dump operation of fixed sum length;

f) The associated frequency subsystem is very simple, having to generate only two sampling frequencies and these can be generated as multiples of a single reference frequency (20.46 MHz minus offset). The offset in the reference frequency serves the dual purpose of introducing an advantageous offset in the carrier frequency at baseband and in the final baseband sample rate relative to 20.46 MHz;

g) To change the offset in baseband carrier frequency or in final sample rate no change in the front end design or in the front end hardware is required. Only a single change in the reference frequency is needed.

In the simplest embodiment of the invention, only one step brings a signal from RF to the desired form at baseband—the sampling operation. Each RF signal, L1 and L2, is separately filtered at RF with a bandwidth of about 20.46 MHz and then sampled at 20.46 MHz−2Δf. Since the sample rate is an exact subharmonic of the nominal L-band carrier (except for a small frequency offset), the signal is aliased to baseband. Again, the frequency offset serves the dual purposes mentioned above. The simplest embodiment offers several important advantages relative to the preferred embodiment:

a) The frequency subsystem is even simpler, requiring only the generation of the single sample frequency of 20.46 MHZ−2Δf;

b) fewer processing steps are required;

c) power consumption is lower;

d) RFI rejection is excellent.

Important disadvantages of the simplest embodiment relative to the preferred embodiment are:

a) Narrower RF filters introduce larger delay errors;

b) oversampling to recover SNR loss caused by quantization can not be applied;

c) sign-flip corrections do not eliminate possible biases in the sampled signal;

d) quadrature (I and Q) samples are more difficult to generate.

Appendix—Commensurate Sampling

This appendix presents a brief explanation of commensurate (subharmonic). sampling, as applied to a GPS receiver. More general analysis can be found in References (1)–(7) listed above in the Background Art portion of this Application.

The signal at each sample point will be a sum of two terms: the GPS signal and noise. Each will be treated separately.

A) Noise Component

The noise at the sampler can be represented as $$V_N(t) = X(t) \cos(2\pi f'_L t) - y(t) \sin(2\pi f'_L t) \tag{A1}$$

where x(t) and y(t) are quadrature noise components and $f'_L$ is the offset carrier frequency defined above. It is generally assumed that the two quadrature noise components are Gaussian distributed, zero-mean random variables that are statistically independent of each other.

Based on the method of subharmonic sampling described above, the sample times will be given by $$t_k^I = k\, D/f'_L \quad \text{for "cosine" (I) points} \tag{A2}$$

$$t_k^Q = t_k^I + \Delta t_Q \quad \text{for "sine" (Q) points} \tag{A3}$$

where k=0, 1, 2, 3, . . . and where D is the commensurability divisor. The constant time offset $\Delta t_Q$ is equivalent to a phase shift at $f'_L$ equal to an odd integer multiple of 90 degrees. For example, when D=1.5, the I sample times in Equation A2 become (0, 1.5, 3, 4.5, . . . )/$f'_L$ and the Q times in Equation A3 become (0.75, 2.25, 3.75, . . . )/$f'_L$, where $\Delta t_Q = 0.75/f'_L$.

When the time values in Equation A2 are substituted in Equation A1, the sine component disappears and the cosine function is equal to +1 or −1. Thus, the cosine (I) component is selected by sampling at the time points in Equation A2. Similarly, one can show that the time points in Equation A3, which are effectively 90 degrees out of phase, select the sine (Q) component. Thus, substituting these time points into the noise equation yields the following expressions for the Kth value of sampled noise:

$$V_N^I = V_N(t_k^I) = \pm x(t_k^I) \tag{A4}$$

$$V_N^Q = V_N(t_k^Q) = \pm y(t_k^I + \Delta t_Q) \tag{A5}$$

where the sign is determined by carrier-commensurate phase. As explained previously, all sign flips are removed in subsequent processing. Implicit in Equations A4 and A5 is the assumption that the effective averaging time of the sampler is small compared to an RF cycle so that the sinusoids can be replaced by their exact values at the time points.

This brief discussion demonstrates that quadrature commensurate sampling of the noise can be viewed as a quadrature down-conversion with a mixing frequency equal to the offset carrier rate, followed by sampling at baseband at the "RF" sample rate. For the sample rate to be adequate, the two-sided noise bandwidth at RF should be no greater than the sample rate. Because the I samples contain the I component of quadrature noise and the Q samples contain the Q component, the I and Q samples are statistically independent and the voltage SNR can be improved by √2 by processing both the I and Q samples.

B) Signal Component

The GPS signal at the sampler can be represented by $$V_S(t) = A\, P(t-\tau) \cos[f_L(t-\tau) + \phi] \tag{A6}$$

where A is an amplitude factor; P(t) is the P code; τ is the delay from the satellite to the receiver; $f_L$ is the nominal carrier frequency; and 100 is a phase shift. Relative to the offset carrier frequency, the signal can be rewritten as $$V_S(t) = A\, P(t-\tau) \cos[(f'_L + \Delta f_L)t - f_L\tau + \phi] \tag{A7}$$

$$= A\, P(t-\tau)[\cos f'_L t\, \cos(\Delta f_L t - f_L\tau + \phi) - \tag{A8}$$
$$\sin f'_L t\, \sin(\Delta f_L t - f_L\tau + \phi)]$$

where $\Delta f_L$ is the offset of $f'_L$ from $f_L$. When sampled at the times in Equations A2 and A3, the quadrature signals become $$V_S(t_k^I) = \pm A\, P(t_k^I - \tau)\, \cos(\Delta f_L t_k^I - f_L\tau + \phi) \tag{A9}$$

$$V_S(t_k^Q) = \pm A\, P(t_k^Q - \tau)\, \sin(\Delta f_L t_k^Q - f_L\tau + \phi) \tag{A10}$$

where the sign flips are the same as those in Equations A4 and A5 and are removed by subsequent processing. These results indicate that quadrature commensurate sampling of the signal component can also be viewed as quadrature down-conversion to baseband with a mixing signal equal to the offset carrier frequency, followed by sampling at the "RF" rate.

Errors are introduced by the quadrature sampling approach described herein. In subsequent processing, it is assumed that the two components in Equations A9 and A10 have been sampled at the same time, which is not exactly correct. For example, note that the Q P-code function is offset in time from the I P-code function by $\Delta t_Q$ so that the Q P-code will appear as though it were advanced by $\Delta t_Q$. When delay is subsequently extracted from the signal obtained by combining associated I and Q samples as though Q time equaled I time, the resulting measured delay will be offset from the actual value by $\Delta t_Q/2$ for all points. Since $\Delta t_Q$ is accurately known, this bias can be easily removed.

Other errors arise from the timetag implicity contained in the delay $\tau$ found in both the P-code function and phase of the Q signal in Equation A10. For the high sample rates discussed in the text and for ground based receivers, the offset $\Delta t_Q$ in the delay timetag causes delay and phase errors in the Q component of the order of $$\Delta \tau \leq \dot{\tau} \, \Delta t_Q \quad (A11)$$

$$\leq 3 \times 10^{-6} * 1 \text{ nsec}$$

$$\leq 0.003 \text{ psec} \quad \text{for delay error}$$

$$\leq 5 \times 10^{-6} \text{cycle at } L1 \quad \text{for phase error}$$

where $\Delta t_Q=1$ nsec has been taken from the preferred embodiment. Errors of this magnitude can be neglected in both phase and delay.

Finally, the Q sample time multiplying $\Delta f_L$ in Equation A10 shifts the phase relative to the phase of Equation A9 by less than 15 microcycles when $\Delta f=15$ KHz and $\Delta t_Q=1$ nsec. Thus, the time shift of the Q signal is of negligible consequence with respect to this term.

Note that the baseband carrier rate is offset from zero by $\Delta f_L$ in Equations A9 and A10. As alluded to above, this rate offset is designed to prevent negative baseband carrier frequencies, a condition that is satisfied if $$\Delta f_L > f_L \dot{\tau} \quad (A12)$$

For the embodiment presented herein, the carrier offset is given by $$\Delta f_L = 154 \Delta f \text{ for } L1$$

$$= 120 \Delta f \text{ for } L2$$

where $\Delta f$ is the offset from 10.23 MHz used in the frequency system to drive the RF sample rate. Since $f_L \dot{\tau} < 5$ KHz for ground-based receivers, $\Delta f_L$ should be greater than about 15 KHz. When $\Delta f=110$ Hz, $\Delta f_L=16940$ Hz for L1 so that the baseband carrier frequency is greater than 10 KHz for all doppler values, as required.

Those having skill in the relevant art will now, as a result of the applicant's disclosure herein, perceive various additions and modifications which may be made to the invention such as those described hereinabove as "Variations" of the preferred embodiment as well as others not specifically alluded to therein. Accordingly, all such additions and modifications are deemed to be within the scope of the invention which is to be limited only by the claims appended hereto.

I claim:

1. A front end for receivers of the type for processing two RF signals, L1 and L2, of the type transmitted by Global Positioning System satellites, the digital front end comprising:

means for filtering said RF signals;

means for respectively sampling said filtered RF signals, the sample rate being 88 (10.23 Mhz–$\Delta f$) for said L1 signal and 96 (10.23 Mhz–$\Delta f$) for said L2 signal, where $\Delta f$ is a selected frequency offset;

means for demultiplexing said L1 and L2 samples for respectively separating the quadrature-cosine samples from the quadrature-sine samples;

means for applying an alternating sign-flip correction to each stream of said quadrature-component samples.

2. The front end recited in claim 1 further comprising means for reducing the data rates of said quadrature-component samples by successively summing said respective sign-corrected quadrature-component samples, wherein the sum length is 22 points for each of the two quadrature-component sample streams for the L1 signal and 24 points for each of the two quadrature component sample streams for the L2 signal.

3. The front end recited in claim 1 further comprising means for reducing the data rates by applying a digital filter to said sign-corrected quadrature-component sample streams.

4. A front end for a receiver for processing at least one RF signal of the type transmitted by Global Positioning System (GPS) satellites, the front end comprising:

means for converting a said GPS-type RF signal from analog form to digital samples at a selected sample rate, wherein said means for converting shifts a said GPS-type RF signal from RF to baseband by aliasing.

5. A front end for a receiver for processing at least one RF signal of the type transmitted by Global Positioning System (GPS) satellites, the front end comprising:

means for converting a said GPS-type RF signal from analog form to digital samples at a selected sample rate, wherein said means for converting shifts a said GPS-type RF signal by aliasing from RF to two quadrature components at baseband.

6. A front end for a receiver for processing at least one RF signal of the type transmitted by Global Positioning System (GPS) satellites, the front end comprising:

means for converting a said GPS-type RF signal from analog form to digital samples at a sample rate of 20.46 MHz–2$\Delta f$, where $\Delta f$ is a selected frequency, wherein said means for converting shifts a said GPS-type RF signal from RF to baseband by aliasing.

7. A front end for a receiver for processing at least one RF signal of the type transmitted by Global Positioning System (GPS) satellites, the front end comprising:

means for converting a said GPS-type RF signal from analog form to digital samples, wherein said means for converting shifts a said GPS-type RF signal by aliasing from RF to two quadrature components at baseband and wherein the sample rate for each quadrature component is 20.46 MHz–2$\Delta f$, where $\Delta f$ is a selected frequency.

8. A front end for a receiver for processing at least one RF signal of the type transmitted by Global Positioning System (GPS) satellites, the front end comprising:

means for converting a said GPS-type RF signal from analog form to digital samples, wherein said means for converting shifts a said GPS-type RF signal by aliasing from RF to two quadrature components at baseband, and wherein the sample rate is equal to $n(10.23 \text{ MHZ} - \Delta f)/D$ where, for a said GPS-type RF signal, n is a selected integer, $\Delta f$ is a selected frequency, and D is equal to another selected integer divided by 2.

9. A front end for a receiver for processing at least one RF signal of the type transmitted by Global Positioning System (GPS) satellites, the front end comprising:

means for converting a said GPS-type RF signal from analog form to digital samples at a selected sample rate of $n(10.23 \text{ MHz} - \Delta f)/D$, where, for a said GPS-type RF signal, n is a selected integer, $\Delta f$ is a selected frequency, and D is equal to another selected integer divided by 2, wherein said means for converting shifts a said GPS-type RF signal by aliasing from RF to baseband.

10. The front end recited in claim 8 further comprising means for reducing the sample rate of said quadrature-component samples by combining samples.

11. The front end recited in claim 9 further comprising means for reducing the sample rate of said digital samples by combining samples.

* * * * *